United States Patent [19]

Cabler

[11] Patent Number: 5,995,030
[45] Date of Patent: *Nov. 30, 1999

[54] APPARATUS AND METHOD FOR A COMBINATION D/A CONVERTER AND FIR FILTER EMPLOYING ACTIVE CURRENT DIVISION FROM A SINGLE CURRENT SOURCE

[75] Inventor: Carlin Dru Cabler, Austin, Tex.

[73] Assignee: Advanced Micro Devices, Sunnyvale, Calif.

[ * ] Notice: This patent is subject to a terminal disclaimer.

[21] Appl. No.: 08/526,834

[22] Filed: Sep. 12, 1995

Related U.S. Application Data

[63] Continuation-in-part of application No. 08/389,362, Feb. 16, 1995, Pat. No. 5,625,357.

[51] Int. Cl.⁶ .................................................. H03M 1/66
[52] U.S. Cl. ............................................ 341/143; 341/144
[58] Field of Search ................................... 341/143, 144, 341/152; 377/42, 48, 76

[56] References Cited

U.S. PATENT DOCUMENTS

| | | | |
|---|---|---|---|
| 3,500,215 | 3/1970 | Leuthoid et al. | 341/143 |
| 4,494,107 | 1/1985 | Kearns et al. | 341/145 |
| 4,683,458 | 7/1987 | Hallgreen | 341/154 |
| 5,043,730 | 8/1991 | Obinata | 341/144 |
| 5,196,850 | 3/1993 | Duffy et al. | 341/76 |
| 5,212,659 | 5/1993 | Scott et al. | 364/724.1 |
| 5,245,344 | 9/1993 | Sooch | 341/150 |
| 5,298,900 | 3/1994 | Mauthe et al. | 341/143 |
| 5,323,157 | 6/1994 | Ledzius et al. | 341/143 |
| 5,376,936 | 12/1994 | Kerth et al. | 341/150 |
| 5,455,582 | 10/1995 | Valdenaire | 341/154 |

FOREIGN PATENT DOCUMENTS 0 506 079 A1  9/1992  European Pat. Off. ......... H03M 3/02

OTHER PUBLICATIONS

"An Integrated Per–Channel PCM Encoder Based on Interpolation," Bruce A. Wooley, et al., *IEEE Transactions on Communications*, vol. COM–27, No. 2, Feb. 1979, pp. 272–277.

"Multirate Filter Designs Using Comb Filters," Shuni Chu, et al., *IEEE Transactions on Circuits and Systems*, vol. CAS–31, No. 11, Nov. 1984, pp. 913–924.

"An Economical Class of Digital FIlters for Decimation and Interpolation," Eugene B. Hogenauer, *IEEE Transactions on Acoustics, Speech, and Signal Processing*, vol. ASSP–29, No. 2, Apr. 1981, pp. 155–162.

"Multirate Digital Filters, Filter Banks, Polyphase Networks, and Applications: A Tutorial," P. O. Vaidyanathan, *Proceedings of the IEEE*, Vol. 78, No. 1, Jan. 1990, pp. 56–93.

"A Multistage Delta–Sigma Modulator without Double Integration Loop," Toshio Hayashi, et al., *1986 IEEE International Solid–State Circuit Conference*, ISSCC 86/Thursday, Feb. 20, 1986/California Pavilion C., THPM 14.6, pp. 182–183.

(List continued on next page.)

*Primary Examiner*—Howard L. Williams
*Attorney, Agent, or Firm*—Joseph W. King, Jr.; Stanford & Bennett, L.L.P.

[57] ABSTRACT

An active current steering semi-digital FIR filter for a digital-to-analog conversion circuit, which includes a shift register having a 1-bit digital input stream and a plurality of output taps, where each output tap provides a 1-bit signal which has a value of a logic 1 or a logic 0, and a plurality of current paths, where each path includes an active element, such as a transistor, having a relatively high output impedance, which is connected to a common current source, and to an op amp for current-to-voltage conversion. The relatively high output impedance of the active current steering element causes any error term resulting from offset at the op amp inputs to be minimized.

23 Claims, 5 Drawing Sheets

OTHER PUBLICATIONS

"A 3–μn CMOS Digital Codec with Programmable Echo Cancellation and Gain Setting," Paul Defraeye, et al., *IEEE Journal of Solid–State Circuits*, vol. SC–20, No. 3, Jun. 1985, pp. 679–687.

"A 17–bit Oversampling D–to–A Conversion Technology Using Multistage Noise Shaping," Yasuyuki Matsuya, et al., *IEEE Journal of Solid–State Circuits*, vol. 24, No. 4, Aug. 1989, pp. 969–975.

"Fourth Order Sigma–Delta Modulator Circuit for Digital Audio and ISDN Applications," T. Karema, et al., Tampere University of Technology, Finland, pp. 223–227.

"Area–Efficient Multichannel Oversampled PCM Voice–Band Coder," Bosco H. Leung, et al., *IEEE Journal of Solid–State Circuits*, vol. 23, No. 6, Dec. 1988, pp. 1351–1357.

"Reduction of Quantizing Noise by Use of Feedback*," H. A. Spang, III, and P. M. Schultheiss, reprinted from *IRE Trans. Commun. Systems*, pp. 373–380, Dec. 1962.

"Design of Stable High Order 1–Bit Sigma–Delta Modulators," Tapani Ritoniemi, et al., Signal Processing Laboratory, Tampere University of Technology, reprinted from *IEEE Proc. ISCAS'90*, pp. 3267–3270, May 1990.

"A Higher Order Topology for Interpolative Modulators for Oversampling A/D Converters," Kirk C.–H. Chao, et al., reprinted from *IEEE Trans. Circuits and Sys.*, vol. CAS–37, pp. 309–318, Mar. 1990.

"A Stereo 16–Bit Delta–Sigma A/D Converter for Digital Audio*," D. R. Welland, et al., reprinted with permission from *Journal of the Audio Engineering Society*, vol. 37, pp. 476–486, Jun. 1989.

"A Monolithic 50 KHz 16–Bit A/D–D/A Converter Using Sigma–Delta Modulation," Charles D. Thompson, et al., Digital Signal Processor Operation/Motorola, Inc. 1990 IEEE.

"A CMOS Oversampling D/A Converter with a Current–Mode Semi–Digital Reconstruction Filter," D. Su and B. Wooley, *1993 ISSCC*, vol. 36, pp. 230–231.

"Design and Implementation of Digital FIR Filters," P. P. Vaidyanathan, Chapter 2 in *Hnadbook of DSP Engineering Applications*, D. F. Elliott, editor, Academic Press, 1987.

"Oversampling A/D & D/A Conversion," B. A. Wooley, Presentation to AMD at Standard University, Sep. 14, 1992.

"Finite Impulse Response Switched–Capacitor Filters for the Delta–Sigma Modulator D/A Interface," P. J. Hurst and James E. C. Brown, *IEEE Trans. Circuits Sys.*, vol. 38, No. 11, pp. 1391–1397, Nov. 1991.

"Analog FIR Filters with an Oversampled Σ–Δ Modulator," H. Qiuting and G. Moscytz, *IEEE Trans. Circuits Syst.*, vol. 39, No. 9, pp. 658–663, Sep. 1992.

David K. Su, et al., "A CMOS Oversampling D/A Converter with a Current–Mode Semidigital Reconstruction Filter," *IEEE Journal of Solid–State Circuits*, vol. 28, No. 12, Dec. 1993, pp. 1224–1233.

Su et al. *A CMOS Oversampling D/A Converter with Current–Mode Semi–Digital Reconstruction Filter*, 1993 International Solid Slate CircuitsConference, Feb. 26, 1993.

APPARATUS AND METHOD FOR A COMBINATION D/A CONVERTER AND FIR FILTER EMPLOYING ACTIVE CURRENT DIVISION FROM A SINGLE CURRENT SOURCE

CROSS-REFERENCE TO RELATED PATENT APPLICATIONS

This patent application is a continuation-in-part of patent application Ser. No. 08/389,362, filed Feb. 16, 1995, now U.S. Pat. No. 5,625,357.

BACKGROUND OF THE INVENTION

1. Field of the Invention

The present invention relates to a digital-to-analog FIR filter. More specifically, the present invention relates to a digital-to-analog filter which uses active current division steering techniques.

2. Brief Description of the Related Technology

Previous methods for digital-to-analog (D/A) signal conversion and reconstruction filtering involve several methods. The actual D/A conversion process has been accomplished using methods such as a single current source and sink, or by dumping charge from a switched capacitor that has been charged to either a positive or negative reference voltage. Reconstruction filtering has been accomplished by using a combination of active and/or passive classical filtering techniques, such as continuous time active filters with resistors and capacitors, continuous time passive filters utilizing resistors, capacitors, and inductors, or switched capacitor filter techniques. A method of filtering which combines a D/A converter with a reconstruction filter has recently become known in the art.

Oversampled D/A converters generally include the following signal processing blocks: (1) an interpolator filter, or series of filters, which raises the sample rate of the incoming digital signal to a higher sample rate, (2) a digital sigma-delta processor (or noise shaper) which lowers the number of bits representing the signal by shaping the quantization noise in a way that places most of it at higher frequencies, (3) a D/A converter which converts the output of the noise shaper into an analog signal, and (4) an analog low pass filter which removes, or substantially lowers, the noise that was placed at higher frequencies by the noise shaper.

In all sigma-delta D/A converters, there exists a need to filter the high frequency noise inherent to this method of conversion. It is common for a digital noise shaper (digital sigma-delta modulator) to have as its output a single bit. The single bit digital output signal is then converted to an analog signal using switched capacitor techniques or switched current source techniques. Once this conversion is made, filtering of the high frequency noise is then accomplished through a variety of means.

Figure 1:
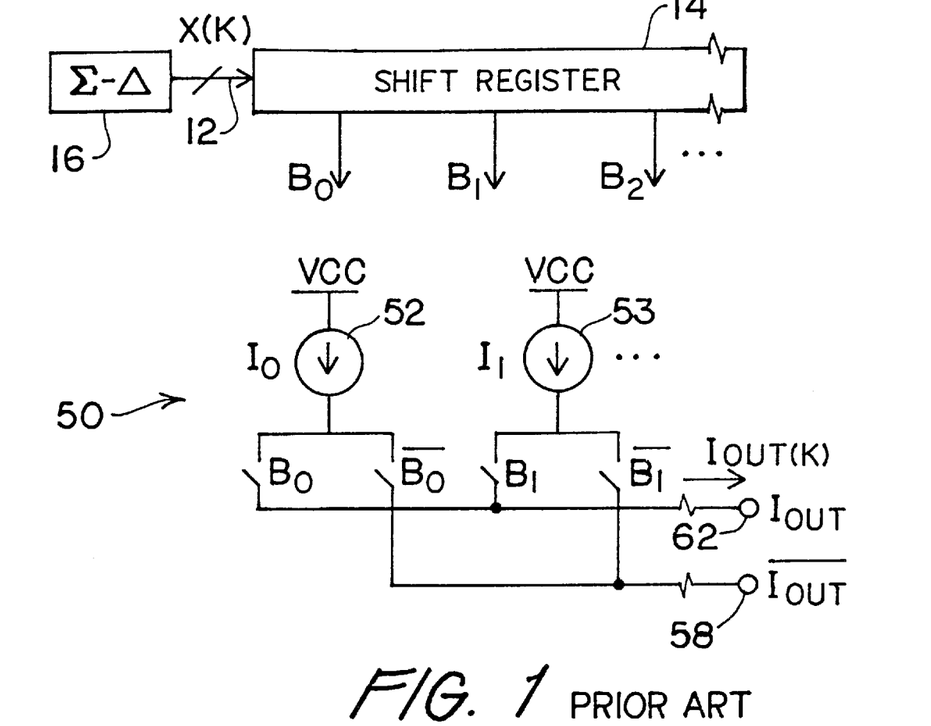
FIG. 1 schematically illustrates a prior art embodiment of a semi-digital FIR filter utilizing a plurality of current sources.

As illustrated in FIG. 1, a semi-digital reconstruction filter typically uses a tapped delay line, or shift register, to control a plurality of devices each of which has an associated gain factor. The outputs of the plurality of devices are then summed together to form a single output of the filter. In some cases, individual current sources are employed as the plurality of devices. The amount of current in each current source is designed such that a desired FIR filter response is achieved. The output of each current source is then provided, or steered, to a current summing node (IOUT) or to an alternative current summing node (IOUT*), depending on the logic state of the control bit ($B_N$) at the delay line tap associated with each current source. The currents at one or both of the current summing nodes are then converted to a voltage using standard current to voltage conversion techniques. Additional filtering may then be employed to remove extremely high frequency noise.

In other cases, the plurality of devices in the semi-digital filter FIR coefficients are represented as charge stored on a plurality of capacitors. The charge on each capacitor can then be summed by employing a switched capacitor summing amplifier. Once again, additional filtering may be employed to remove any extremely high frequency noise.

In another semi-digital filter scheme, the FIR coefficients are represented as a current value through a plurality of resistors. Each resistor is selectively connected to a voltage reference depending on the state of the individual control bit from the delay line tap associated with each individual resistor. The current is then summed and converted to a voltage by means of resistive feedback around an operational amplifier (op amp). As in the previous methods discussed, additional filtering may be employed to remove any high frequency noise.

Previous current steering semi-digital FIR filters utilize current paths having linear resistors, or resistive elements such as FETs or CMOS transmission gates biased in the linear region. This results in relatively low output impedance of the resistive elements of the filter. Any offset on inputs to an operational amplifier (op amp) connected to the current paths in the prior filter circuits may cause an error term. Since the current through each path is dependent on the resistance of the resistive element in each path, the state of the switches and the op amp offset, the FIR coefficients for the filter, as determined by the current in each path, are a function of the op amp offset. A need exists to minimize, or eliminate, this offset distortion term.

SUMMARY OF THE INVENTION

The method and apparatus described herein is one which uses a single current reference and an active current divider network which includes a plurality of parallel current paths. The current through each path is actively steered by transistors to a current summing node, or an alternative current summing node, depending on the logic level of a control bit at a delay line tap associated with each path. A shift register which shifts the single bit, output signal from a digital sigma-delta modulator, forms a delay line. The shift register includes a series of flip-flops.

The output of each flip flop provides the input of the next flip flop in the series. All flip-flops are clocked at the same rate. The output of each flip flop also provides the control bit associated with each current path. That is, for an individual path, if the control bit is a logic 1, the current through the path is actively steered to the current summing node. If the control bit is a logic 0, the current is actively steered to the alternative current summing node. Since a tapped delay line and a summed output(s) consisting of weighted values (with weight determined by conductance value of each path) of the intermediate points in the tapped delay line are provided, a Finite Impulse Response (FIR) filter exists. Such a filter may be designed using techniques available to those skilled in the art. Any type of filter such as bandpass, bandreject, high pass, and low pass may be built using this technique. The present invention is directed to, a low pass filter which is desirable to remove high frequency noise generated by a sigma-delta data conversion process.

Transistors biased in the saturation region are utilized as active current steering elements in each current path to actively steer current. This results in the elements in each current path having a relatively high output impedance, which minimizes the effect of any op amp offset. This causes the FIR filter signal response to be more reliable than when passive resistive elements are utilized.

DETAILED DESCRIPTION OF THE PREFERRED EMBODIMENT

The present invention utilizes a single reference current, IREF, an active current division network, a method for steering the output of each individual transistor element in the current steering network, a current summing node, an alternative current summing node, and a method to convert the current in the current summing node to a voltage.

FIG. 1 illustrates a prior art implementation of a semi-digital FIR filter 50 using a plurality of current sources 52 and 53. The 1-bit output from a sigma-delta modulator 16 is input to shift register 14 as input signal 12. Sigma-delta modulator 16 preferably includes an interpolation circuit and a noise shaping circuit. Various interpolation circuits known in the art may be utilized, however, the preferred digital interpolation circuit is described in application Ser. No. 08/333,399, filed Nov. 2, 1994, entitled "Digital Interpolation Circuit for A digital-to-analog Converter Circuit", assigned to the common assignee of the present invention. Likewise, various digital noise shaping circuits may be utilized, however, the preferred noise shaper circuit is described in application Ser. No. 08/333,386, filed Nov. 2, 1994, entitled "Digital Noise shaper Circuit", assigned to the common assignee of the present invention.

The current flows through the non-inverted current switches ($B_0$, $B_1$) to non-inverted current summing node 62 and through inverted current switches ($B_0^*$, $B_1^*$) to inverted current summing node 58. Switches $B_0$ and $B_0^*$ are controlled by the logic level of output tap $B_0$ of shift register 14. Switches $B_1$ and $B_1^*$ are controlled by the logic level of output tap $B_1$. If output tap $B_0$ is a logic 0, inverted current switch $B_0^*$ is closed and non-inverted switch $B_0$ is open, causing current to flow from current source 52 to inverted current summing node 58. If output tap $B_0$ is a logic 1, non-inverted current switch $B_0$ is closed and inverted current switch $B_0^*$ is open, causing current to flow from current source 52 to non-inverted current summing node 62. Non-inverted current switch $B_1$ and inverted current switch $B_1^*$ would function in a similar manner, causing current to flow from current source 53 to non-inverted current summing node 62 or inverted current summing node 58, depending on the logic value of shift register output tap $B_1$.

Figure 2:
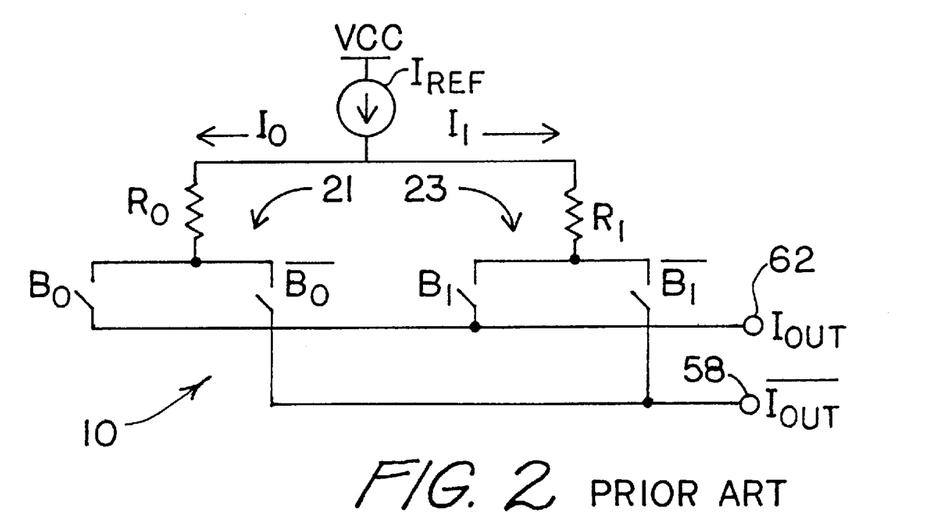
FIG. 2 schematically illustrates a prior art semi-digital FIR filter which uses a single current source and passive current steering techniques.

FIG. 2 illustrates a prior art semi-digital FIR filter current steering circuit 10. FIG. 2 depicts a current steering circuit 10 which includes two control bits ($B_0$ and $B_1$) and their logical inverses ($B_0^*$ and $B_1^*$) which are output from shift register 14 as output tap $B_0$ and $B_1$, respectively. These control bits are used to control whether the current in an individual resistive path 21, 23 is steered to non-inverted current summing node 62 (IOUT), or to the alternative current summing node, inverted current summing node 58 (IOUT*). In order for the individual currents through the resistive paths 21, 23 to remain constant, the current summing nodes 62, 58 (IOUT and IOUT*) must be held at identical voltages. For the example shown in FIG. 2, it will be assumed that summing nodes 62 and 58 (IOUT and IOUT*) are at zero volts. Thus, the current through resistive path 21, represented by resistive element R0, is represented by the following equation:

$$I_0 = IREF[R_1/(R_0+R_1)]$$

Likewise, the current through resistive path 23, represented by resistive element $R_1$, is given by the following equation:

$$I_1 = IREF[R_0/(R_0+R_1)]$$

Therefore, the current in non-inverted current summing node 62 (IOUT) can be represented by the following equation:

$$IOUT(k) = I_0[x(k)] + I1 \times [x(k-1)]$$

where x(k) is the digital input signal 12, illustrated in FIG. 1, where input signal 12 (x(k)) is output from sigma-delta modulator 16, and where IOUT(k) represents the output current in the non-inverted current summing node 62, and $I_0$ and $I_1$ are the currents through the two resistive paths 21, 23, for $R_0$ and $R_1$, respectively.

The standard equation for an FIR filter is given by:

$$y(k) = a_0[x(k)] + a_1[x(k-1)] + \ldots a_n[x(k-n)]$$

Since the equation for non-inverted current IOUT(k) is of the same form as for y(k), the structure illustrated in FIG. 1 is an FIR filter. The equation for non-inverted current IOUT(k) can also be written in the following way by substituting $I_0$ and $I_1$ as their equivalent functions of current source IREF, resistive elements $R_0$ and $R_1$, as given in the above equations by:

$$IOUT(k) = [IREF[R_1/(R_0+R_1)]]x(k) + [IREF[R_0/(R_0+R_1)]]x(k-1)$$

Table 1 provides the summed currents IOUT and IOUT* for all possibilities of switches $B_0$ and $B_1$ in FIG. 2.

TABLE 1

| $B_0$ | $B_1$ | IOUT | IOUT* |
|---|---|---|---|
| 0 | 0 | 0 | IREF |
| 0 | 1 | $\dfrac{R_0 IREF}{R_0 + R_1}$ | $\dfrac{R_1 IREF}{R_0 + R_1}$ |

TABLE 1-continued

| $B_0$ | $B_1$ | IOUT | IOUT* |
|---|---|---|---|
| 1 | 0 | $\dfrac{R_1 IREF}{R_0 + R_1}$ | $\dfrac{R_0 IREF}{R_0 + R_1}$ |
| 1 | 1 | IREF | 0 |

Figure 3:
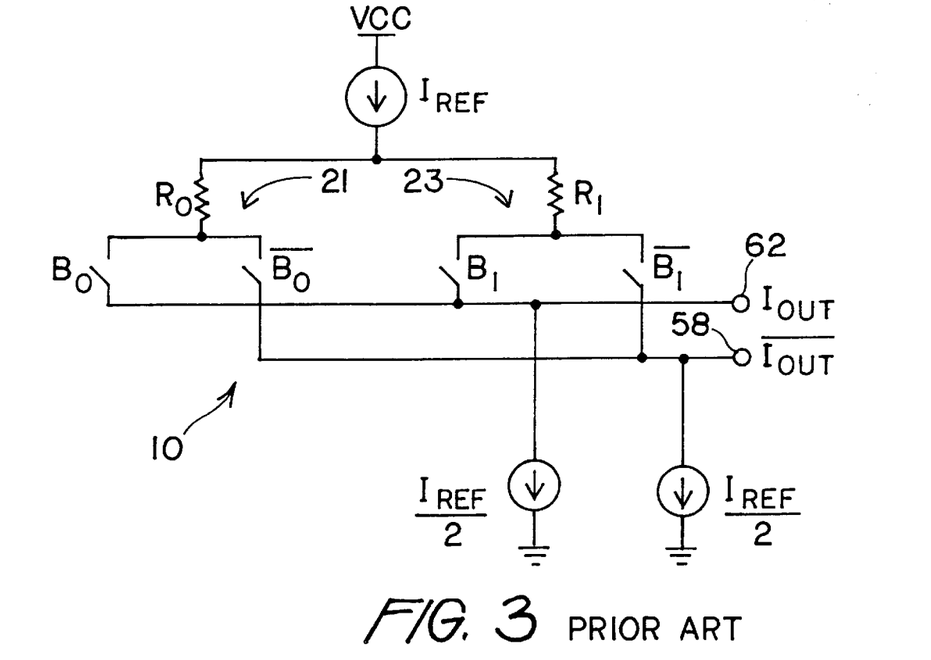
FIG. 3 schematically illustrates a prior art embodiment which removes an effective DC offset using a current source.

Since, in FIG. 1, input signal 12 (x(k)) can take on only a value of logic 0 or logic 1, current summing nodes IOUT and IOUT* can only be equal to zero or positive values. In fact, both current summing nodes IOUT and IOUT* may take on values from zero to the value of current source IREF (FIG. 2). Thus, the structure illustrated in FIG. 2 adds an effective DC offset with a value of IREF/2. This can easily be removed by subtracting a fixed amount of current, IREF/2, from current summing nodes IOUT and IOUT*, as shown in FIG. 3. Table 2 illustrates that both current summing nodes, IOUT and IOUT*, may take on values from –IREF/2 to IREF/2.

TABLE 2

| $B_0$ | $B_1$ | IOUT | IOUT* |
|---|---|---|---|
| 0 | 0 | $\dfrac{-IREF}{2}$ | $\dfrac{IREF}{2}$ |
| 0 | 1 | $\dfrac{R_0 IREF}{R_0 + R_1} - \dfrac{IREF}{2}$ | $\dfrac{R_1 IREF}{R_0 + R_1} - \dfrac{IREF}{2}$ |
| 1 | 0 | $\dfrac{R_1 IREF}{R_0 + R_1} - \dfrac{IREF}{2}$ | $\dfrac{R_0 IREF}{R_0 + R_1} - \dfrac{IREF}{2}$ |
| 1 | 1 | $\dfrac{IREF}{2}$ | $\dfrac{-IREF}{2}$ |

In fact for each combination of switches $B_0$ and $B_1$, the value of inverted current summing node 58, IOUT*, is equal to negative the value of non-inverted current summing node 62, –[IOUT]. Thus, the inverted and non-inverted currents are differential in nature. This differential current embodiment is used to remove any even-ordered distortion which may occur.

Figure 4:
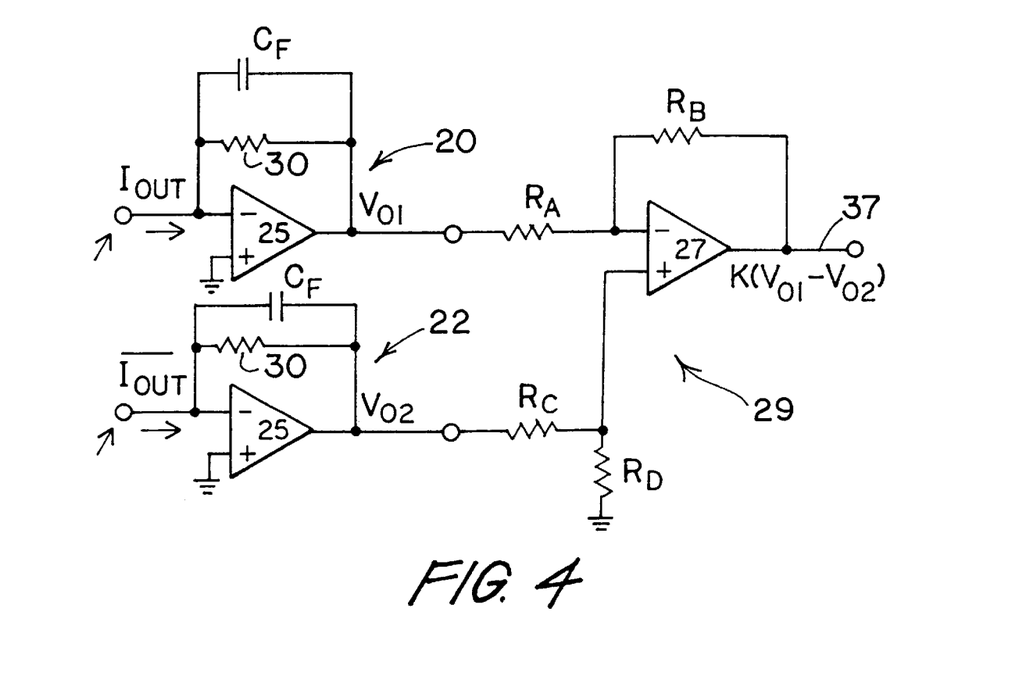
FIG. 4 schematically illustrates an embodiment of the present invention which utilizes differential currents and differential voltages.

FIG. 4 illustrates a method of converting current summing nodes IOUT and IOUT* from differential currents to differential voltages via operational amplifier circuits 20 and 22. Each op amp circuit, 20 and 22, includes an op amp 25 and a feedback resistor 30. If desired, the differential voltages in this embodiment may be converted to a single-ended voltage 37 using series input resistor $R_A$, voltage divider resistor network $R_C$ and $R_D$ and feedback resistor $R_B$ together with op amp 27, as shown in FIG. 4. As stated previously, additional filtering of extremely high frequency noise can then be accomplished by connecting a capacitor $C_F$ in parallel to feedback resistor 30 in FIG. 4.

Figure 5A:
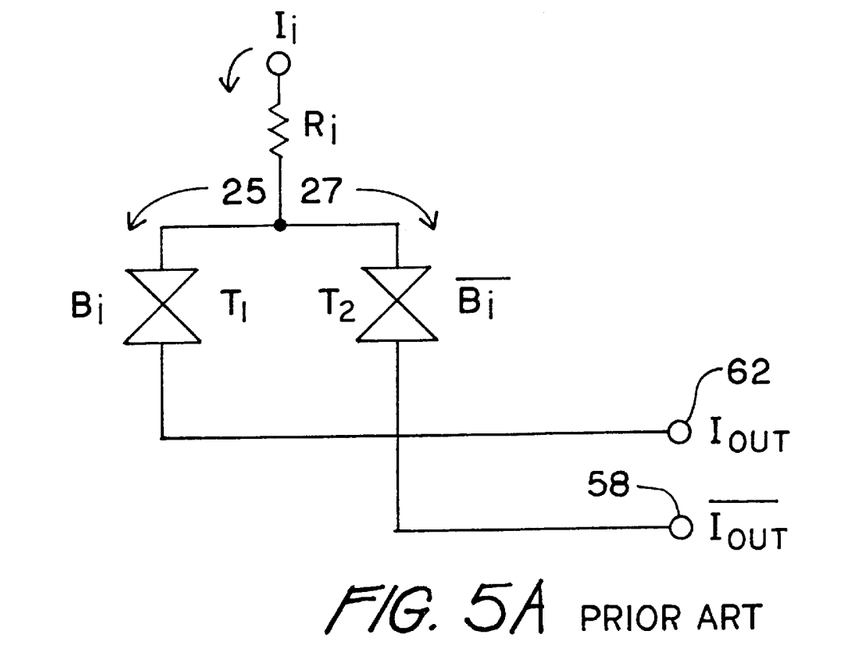
FIGS. 5a–c schematically illustrate various prior art embodiments to implement the resistive paths or R0 and R1 associated with the switches of FIGS. 2 and 3.

Several prior art techniques may be used to implement the resistive paths 21 and 23, via resistive elements R0 and R1 and associated switches $B_0$, $B_0$*, $B_1$, and $B_1$* of FIGS. 2 and 3. Resistive elements $R_0$ and $R_1$ may be resistors, as shown in FIGS. 2 and 3. As shown in FIG. 5a, an explicit resistor $R_i$ and a pair of switches $B_i$ and $B_i$* are utilized to implement resistive paths 25 and 27. The resistor $R_i$ may be realized as a poly resistor, a diffused resistor, a thin film resistor, or by any of the standard methods of realizing resistors. The switches $B_i$ and $B_i$* may be realized by employing CMOS transmission gates $T_1$ and $T_2$, or single MOSFETS, to act as switches. In the technique of FIG. 5a, the resistance of an individual resistive path 25 or 27 would be the sum of the explicit resistor, $R_i$, plus the effective "on" resistance of the switch $B_i$ or $B_i$*. Care must be taken to make the "on" resistance of $T_1$ and $T_2$ negligible with respect to $R_i$, or, alternatively, the "on" resistance of the switch $B_i$ or $B_i$* may also be ratioed by the same ratio which is used to calculate $R_i$. However, like the prior art techniques shown in FIG. 1, discussed above, any error in effective static switch "on" resistance will only change the effective FIR coefficient for the filter and will not affect the linearity of the filter.

Figure 5B:
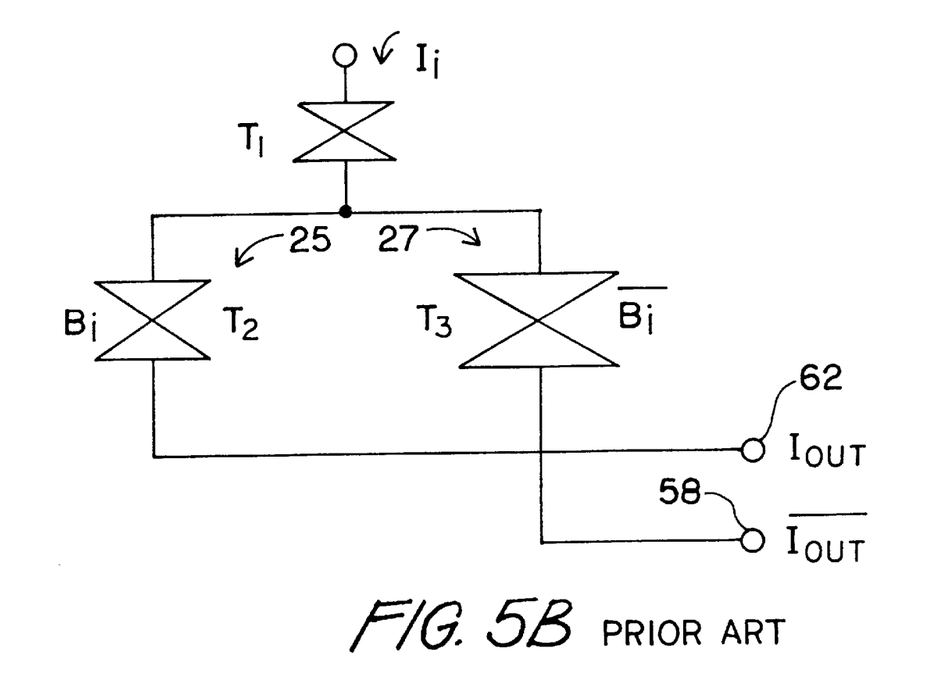

Another technique that may be used to implement resistive paths 25 and 27 is shown in FIG. 5b, is to realize $R_0$ or $R_1$ in FIGS. 2 and 3 as the effective "on" resistance of a CMOS transmission gate $T_1$, or single MOSFET transistor biased in the triode (linear or resistive) region when turned on. In FIG. 5b, $T_1$ represents the effective resistance for $R_0$ or $R_1$. The switches $B_i$ and $B_i$* are likewise realized as CMOS transmission gates $T_2$ and $T_3$, or as single MOSFET transistors. The switches $B_i$ and $B_i$* are designed such that the effective "on" resistance of gate $T_2$ is identical to the effective "on" resistance of gate $T_3$. Thus, the effective resistance of the resistive paths 25 or 27 is the sum of the "on" resistance of gate $T_1$ plus the "on" resistance of gate $T_2$ or $T_3$. Like the technique described above for FIG. 5a, the "on" resistance of gate $T_2$ and $T_3$ must either be made negligible with respect to the "on" resistance of gate $T_1$, or they must be ratioed by the same ratio which is used to calculate the "on" resistance of gate $T_1$. Once again, any error in effective static switch "on" resistance will only change the effective FIR filter coefficient and will not affect the linearity of the analog signal at current summing nodes 62 and 58, IOUT and IOUT*.

Figure 5C:
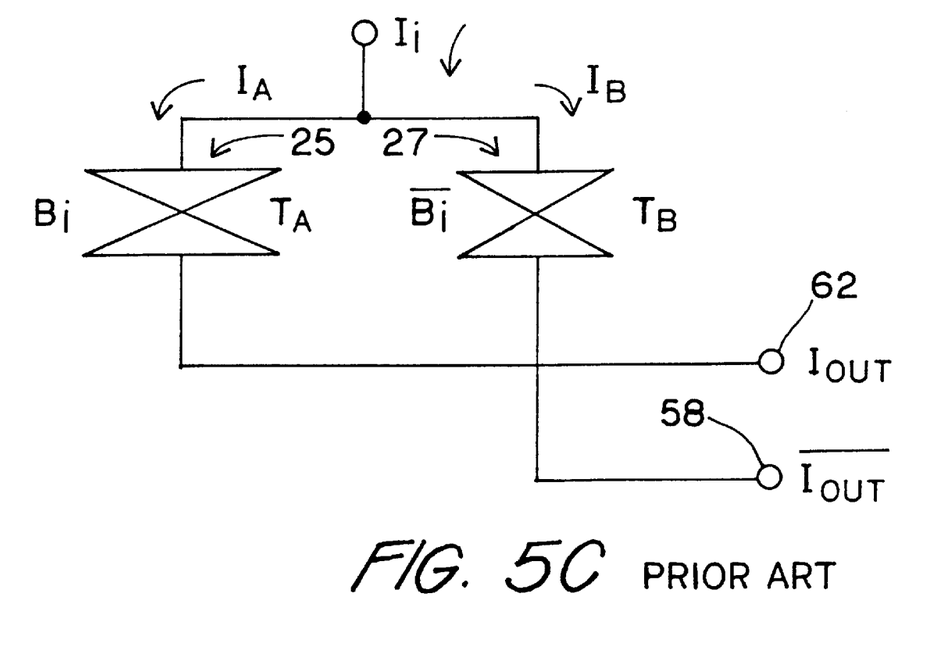

An alternative prior technique that may be used to implement resistive paths 25 and 27, shown in FIG. 5c. Resistive elements $R_0$ and $R_1$ and switches $B_0$, $B_0$*, $B_1$, and $B_1$* are implemented as individual CMOS transmission gates $T_A$ and $T_B$, or as single MOSFET transistors. In this case, the "on" resistance of gate $T_A$ is designed to be equivalent to the "on" resistance of gate $T_B$. Thus, the effective resistance of the resistive paths 25 or 27 is the "on" resistance of gates $T_A$ or $T_B$. Like the above methods shown in FIGS. 5a or 5b, any error in effective static "on" resistance will only change the effective FIR filter coefficient (and therefore the frequency response of the filter) and not the linearity of the analog signal which results from using this technique.

The prime reason the current steering structure of FIGS. 2 and 3 is linear is because the effective current through each resistive path 21 or 23 is not dependent on the current through any of the other resistive path. Thus, ideally, the current through a resistive path 21 or 23 should not depend on the 1-bit digital input signal 12, x(k), of FIG. 1. This is true for the ideal cases of the three techniques described above and illustrated in FIGS. 5a–c. In practice, however, this may not be completely true.

If, in FIG. 5c, due to random manufacturing resistance mismatches, the "on" resistance of gate $T_A$ is not equivalent to the "on" resistance of gate $T_B$, assuming, for example, that $T_A$ and $T_B$ are the same size, nominally, then current $I_A$ passing through switch $T_A$ when shift register output tap $B_i$ is a logic 1 would not be equivalent to current $I_B$ through gate $T_B$ when output tap $B_i$* is a logic 0. This means current $I_i$ through a resistive path 25 or 27, rather than being constant, is dependent on the input signal 12, x(k). This concept also applies to the embodiments illustrated in FIGS.

5a and 5b. Since the FIR filter structure as a whole is built as a current divider, if the current in one resistive path 25 or 27 changes, the amount of current through all paths 25 and 27 must change in order for the total current to remain equal to reference current IREF. Thus, there is potential for harmonic distortion to result. One of the first assumptions is that the value of current summing nodes IOUT and IOUT* must be held at the same potential. In practice, this may not be possible due to random op amp offset voltages. Fortunately, to the extent the harmonic distortion is even-ordered, using differential non-inverted and inverted currents, IOUT and IOUT*, and converting them to differential voltages as shown in FIG. 4, will reduce the total harmonic distortion.

Figure 6:
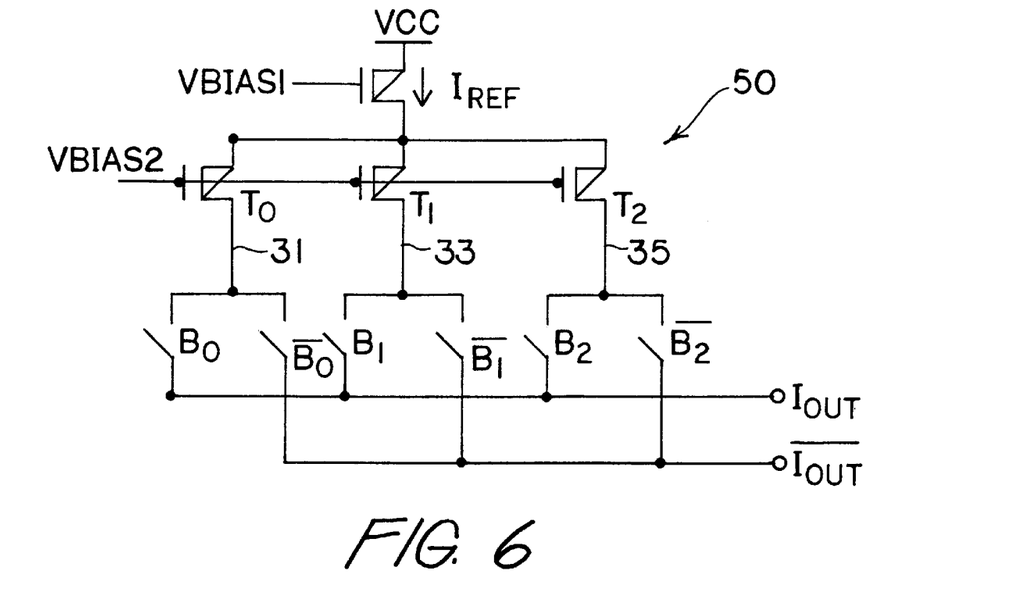
FIG. 6 schematically illustrates a semi-digital FIR filter of the present invention which uses a single current source and active current steering techniques.

FIG. 6 illustrates a FIR filter circuit 50 and method of the present invention for actively steering current through a plurality of current paths. The single current source, IREF is biased by signal VBIAS1. IREF is divided into smaller branch currents by means of MOS transistors $T_0$–$T_2$, which are biased in the saturation region, to actively steer current through current branches, or paths, 31, 33 and 35, respectively. Transistors $T_0$–$T_2$ are biased by signal VBIAS2 in the saturation region, which results in the transistors having a relatively high output impedance. The amount of current in each branch of the FIR filter circuit 50 is determined by the effective W/L ratio of each individual transistor, $T_0$–$T_2$, with respect to the sum of all the W/L ratios. Since each transistor has the same gate voltage and the same drain voltage, those transistors with larger W/L ratios will conduct proportionately larger current than those with smaller W/L ratios. The W/L ratio of each transistor is sized to implement effective coefficients for the FIR filter circuit 50.

The current through each branch is defined by the following equation:

$$I_i = IREF * (W/L)_i / (W/L)_{total}$$

In the above equation, IREF is the single master current, $(W/L)_i$ is the W/L ratio for each transistor and $(W/L)_{total}$ is the sum of all W/L ratios for all transistors. Thus, a semi-digital FIR filter having (n+1) taps implemented with this technique would produce an output current described by the following equation:

$$IOUT = Z0*IREF + Z1*IREF*Z^{-1} + Z2*IREF*Z^{-2} + \ldots + Zn*IREF*z^{-n}$$

Where $Z_i$ is $(W/L)_i/(W/L)_{total}$

Figure 7:
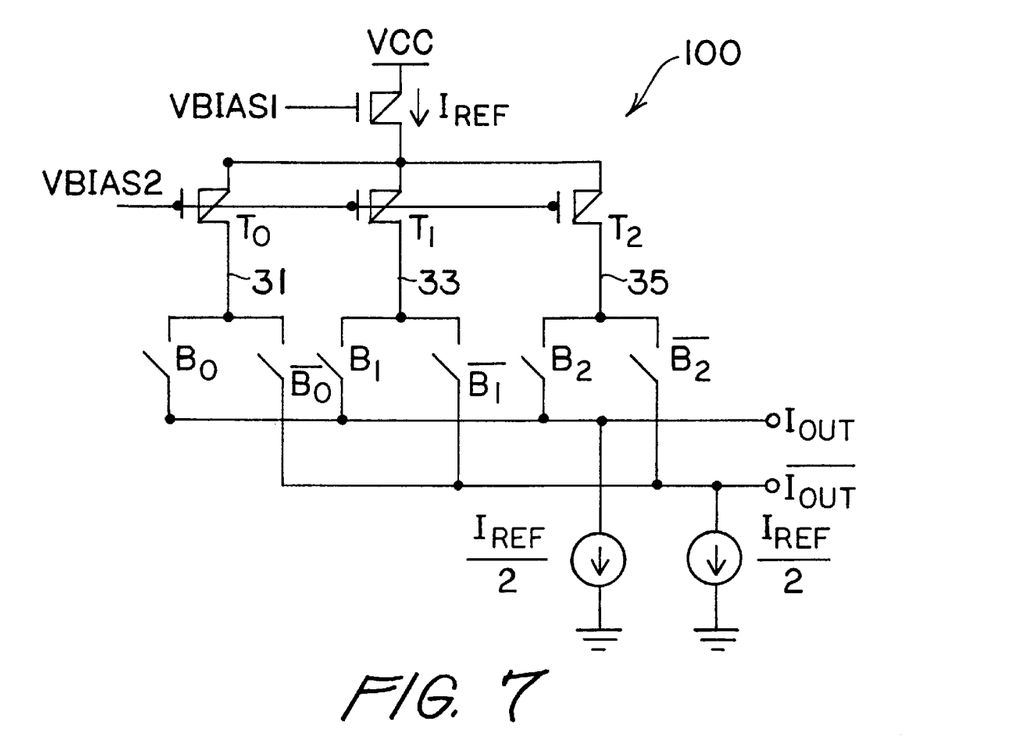
FIG. 7 schematically illustrates an embodiment of the present invention which removes an effective DC offset using a current source.

As illustrated in FIG. 7, an active DC offset compensation current steering filter circuit 100, having differential current outputs IOUT and IOUT*, includes DC offset current sinks IREF/2 connected to IOUT and IOUT* to reduce the effect of the DC offset, for the reasons discussed previously in regard to FIGS. 2 and 3. The differential current-to-voltage conversion circuit 29 of FIG. 4 is connected to the active current steering FIR filter circuit 50 of FIG. 6 or circuit 100 of FIG. 7, such that the IOUT lines of FIGS. 4 and 6 are connected, and the IOUT* lines of FIGS. 4 and 6 are connected, respectively. With the relatively high output impedance of transistors $T_0$–$T_2$ in FIGS. 6 and 7, the effect of any offset at the inputs of op amps 25 of FIG. 4 are minimized.

The switches, $B_0$ and $B_0^*$, etc. of FIGS. 6 and 7 may be implemented using CMOS transmission gates, or using single MOSFET transistors biased in the linear region.

The present invention, therefore, is well adapted to carry out the objects and attain the ends and advantages mentioned herein as well as other ends and advantages made apparent from the disclosure. While preferred embodiments of the invention have been described for the purpose of disclosure, numerous changes and modifications to those embodiments described herein will be readily apparent to those skilled in the art and are encompassed within the spirit of the invention and the scope of the following claims.

What is claimed is:

1. An FIR filter for a digital-to-analog conversion circuit, comprising:
   (a) a shift register having a 1-bit digital input stream and a plurality of output taps, wherein each said output tap provides a 1-bit signal which has a value of a logic 1 or a logic 0;
   (b) a single current source having a current output divided by a plurality of current paths, wherein each said path includes an active element having a high output impedance, each said active element being connected to a first terminal of an active high switch and a first terminal of an active low switch;
   wherein a single said output tap of said shift register is used to control said active high switch and said active low switch for a single current path; and
   wherein a second terminal of each said active high switch of each of said plurality of current paths is connected to a non-inverted output current path, and a second terminal of each said active low switch for each of said plurality of current paths is connected to an inverted output current path.

2. The filter of claim 1, wherein said 1-bit digital input stream is output from an oversampled sigma-delta converter circuit.

3. The filter of claim 2, wherein said sigma-delta converter circuit comprises a digital interpolation circuit and a noise shaping circuit, wherein the output from said noise shaping circuit comprises said 1-bit digital input stream input to said shift register of said FIR filter.

4. The filter of claim 1, further comprising a differential current-to-voltage conversion circuit, comprising:
   a first operational amplifier circuit having an input connected to said non-inverted current path and a first feedback resistor connected between said first op amp input and a first op amp output; and
   a second operational amplifier circuit having an input connected to said inverted current path and a second feedback resistor connected between said second op amp input and a second op amp output;
   wherein the voltage output from said first and said second op amp outputs comprises a differential output voltage.

5. The filter of claim 4, further comprising a means for converting said differential output voltage to a single-ended voltage.

6. The filter of claim 5, wherein said means for converting comprises a third operational amplifier, having a negative and a positive input terminal;
   wherein said negative input terminal is connected to a third feedback resistor and to a series input resistor;
   wherein said positive input terminal is connected to a voltage divider resistor network; and
   wherein said series input resistor is also connected to said output of said first operational amplifier circuit and said voltage divider resistor network is also connected to said output of said second operational amplifier circuit.

7. The filter of claim 4, further comprising a first high frequency feedback capacitor connected in parallel with said first feedback resistor and a second high frequency feedback capacitor is connected in parallel with said second feedback resistor.

8. The filter of claim 1, wherein at least one of said active elements comprises a transistor.

9. The filter of claim 1, wherein at least one of said active elements comprises a MOS transistor biased in the saturation region.

10. The filter of claim 1, further comprising a DC offset current source connected to said inverted output current path and to said non-inverted output current path.

11. A method of converting a 1-bit digital input signal to an analog output signal, comprising the steps of:

(a) inputting said 1-bit digital input signal to a shift register;

(b) shifting said 1-bit signal through said shift register;

(c) providing, as a control bit, said shifted 1-bit signal to a plurality of output taps disposed along said shift register, wherein said control bit has a value of either a logic 1 or a logic 0;

(d) controlling a plurality of non-inverted current switches and inverted current switches with said bit-values of said shift register output taps, wherein a single output tap value controls a single pair of switches comprised of a single non-inverted current switch and a single inverted current switch, and wherein said plurality of non-inverted current switches and inverted current switches are connected to a common current source;

(e) producing a differential current from said plurality of non-inverting current switches and inverting current switches; and (f) inputting said differential current to a first and a second op amp circuit, wherein a differential voltage is output from said first and second op amp circuits.

12. The method of claim 11, wherein said 1-bit digital input signal input to said shift register is output from an oversampled sigma-delta converter circuit.

13. The method of claim 12, wherein said sigma-delta converter circuit comprises a digital interpolation circuit and a noise shaping circuit, wherein said 1-bit digital signal input to said shift register is output from said noise shaping circuit.

14. The method of claim 11, wherein said first and second op amp circuits each include a feedback resister.

15. The method of claim 11, wherein said first and second op amp circuits each include a high frequency feedback capacitor.

16. The method of claim 11, further comprising the step of using a DC offset current source connected to said differential current to subtract a DC offset current value from said differential current.

17. The method of claim 11, further comprising the step of providing said differential voltage output from said first and second op amp circuits to a third op amp circuit which provides a single-ended output voltage.

18. The method of claim 17, wherein said third op amp circuit includes a series resistor connected to a first input of said third op amp circuit and a voltage divider resistor network connected to a second input of said third op amp circuit.

19. The method of claim 11, wherein each of said plurality of non-inverted current switches and inverted current switches are connected to said common current source through an active element.

20. The method of claim 19, wherein said active element comprises a transistor.

21. The method of claim 19, wherein said active element comprises a MOS transistor biased in the saturation region.

22. A method of converting a 1-bit digital input signal to an analog output signal, comprising the steps of:

(a) inputting said 1-bit digital input signal to a shift register;

(b) shifting said 1-bit signal through said shift register;

(c) providing, as a control bit, said shifted 1-bit signal to a plurality of output taps disposed along said shift register, wherein said control bit has a value of either a logic 1 or a logic 0;

(d) producing a differential current at a pair of current summing nodes by using said control bits to open or close switches disposed along a plurality of current paths connected to a common reference current source, wherein a DC offset current is subtracted from said differential current; and (e) inputting said differential current to a current-to-voltage conversion circuit, wherein a differential voltage is output from said current-to-voltage conversion circuit.

23. The method of claim 22, wherein said DC offset current is equal to one-half the value of said common reference current source.

* * * * *